United States Patent
Chen et al.

(10) Patent No.: US 9,099,420 B2
(45) Date of Patent: Aug. 4, 2015

(54) TEST STRUCTURES FOR POST-PASSIVATION INTERCONNECT

(71) Applicant: Taiwan Semiconductor Manufacturing Company, Ltd., Hsin-Chu (TW)

(72) Inventors: Hsien-Wei Chen, Hsin-Chu (TW); Jie Chen, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 214 days.

(21) Appl. No.: 13/691,439

(22) Filed: Nov. 30, 2012

(65) Prior Publication Data

US 2014/0151698 A1    Jun. 5, 2014

(51) Int. Cl.
*H01L 23/52* (2006.01)
*H01L 21/66* (2006.01)
*H01L 23/31* (2006.01)
*H01L 23/58* (2006.01)
*H01L 23/00* (2006.01)

(52) U.S. Cl.
CPC ............ *H01L 22/34* (2013.01); *H01L 23/3192* (2013.01); *H01L 23/585* (2013.01); *H01L 24/05* (2013.01); *H01L 24/11* (2013.01); *H01L 24/13* (2013.01); *H01L 24/94* (2013.01); *H01L 2224/0401* (2013.01); *H01L 2224/05569* (2013.01); *H01L 2224/05572* (2013.01); *H01L 2224/05666* (2013.01); *H01L 2224/05681* (2013.01); *H01L 2224/1183* (2013.01); *H01L 2224/131* (2013.01); *H01L 2224/13147* (2013.01); *H01L 2224/13455* (2013.01); *H01L 2224/13464* (2013.01); *H01L 2224/94* (2013.01); *H01L 2924/00014* (2013.01); *H01L 2924/1032* (2013.01); *H01L 2924/10253* (2013.01); *H01L 2924/10271* (2013.01); *H01L 2924/10272* (2013.01); *H01L 2924/14* (2013.01)

(58) Field of Classification Search
CPC ........................... H01L 22/32; G01R 31/2884
USPC .......... 257/737–738, 750, E21.158, E21.508, 257/E23.021, E21.499
See application file for complete search history.

(56) References Cited

U.S. PATENT DOCUMENTS

| | | | | |
|---|---|---|---|---|
| 6,066,561 A | * | 5/2000 | Kumar et al. | 438/689 |
| 6,228,684 B1 | * | 5/2001 | Maruyama | 438/113 |
| 8,581,400 B2 | * | 11/2013 | Liang et al. | 257/737 |
| 2013/0001776 A1 | * | 1/2013 | Yu et al. | 257/738 |
| 2013/0314120 A1 | * | 11/2013 | Hu et al. | 324/762.03 |

* cited by examiner

*Primary Examiner* — Mohammad Islam
*Assistant Examiner* — Ankush Singal
(74) *Attorney, Agent, or Firm* — Slater & Matsil, L.L.P.

(57) ABSTRACT

An integrated circuit structure includes a passivation layer, a polymer layer over the passivation layer, and a PPI monitor structure. The PPI monitor structure includes a portion overlying a portion of the polymer layer. The PPI monitor structure is electrically floating.

20 Claims, 10 Drawing Sheets

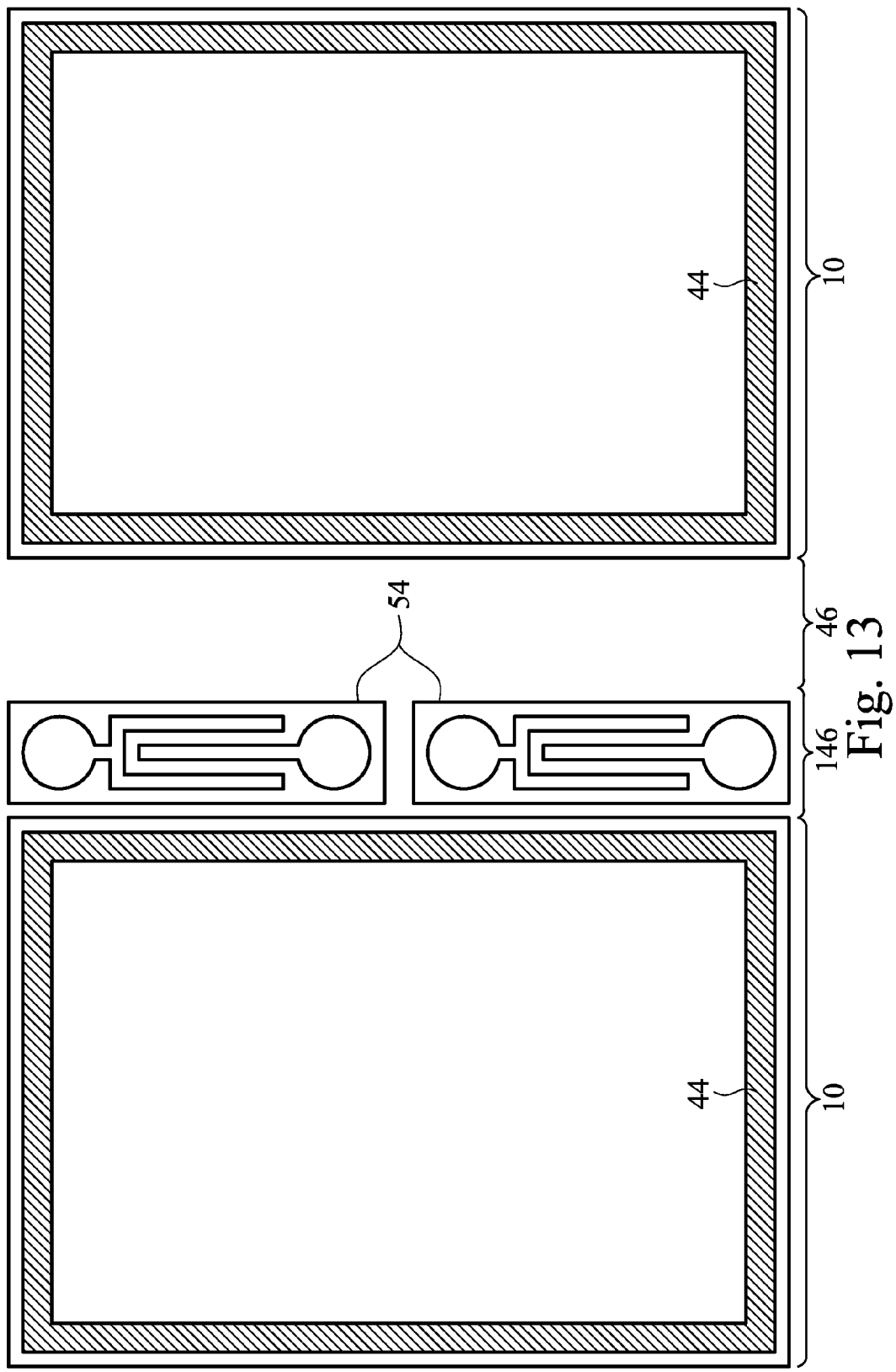

TEST STRUCTURES FOR POST-PASSIVATION INTERCONNECT

BACKGROUND

In the formation of integrated circuits, devices such as transistors are formed at the surface of a semiconductor substrate in a wafer. An interconnect structure is then formed over the integrated circuit devices. A metal pad is formed over, and is electrically coupled to, the interconnect structure. A passivation layer and a first polymer layer are formed over the metal pad, with the metal pad exposed through the openings in the passivation layer and the first polymer layer.

Post-passivation interconnect (PPI) is then formed, followed by the formation of a second polymer layer over the PPI. An Under-Bump-Metallurgy (UBM) is formed extending into an opening in the second polymer layer, wherein the UBM is electrically connected to the PPI. A solder ball is then placed over the UBM and reflowed.

BRIEF DESCRIPTION OF THE DRAWINGS

For a more complete understanding of the embodiments, and the advantages thereof, reference is now made to the following descriptions taken in conjunction with the accompanying drawings, in which:

FIG. 13 illustrates a wafer comprising a scribe line and a dummy scribe line, wherein PPI monitor structures are formed in the dummy scribe line.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

An integrated circuit structure including a Post-Passivation Interconnect (PPI) monitor structure and the methods of forming the same are provided in accordance with various exemplary embodiments. The intermediate stages of forming the integrated circuit structure are illustrated. The variations and the operation of the embodiments are discussed. Throughout the various views and illustrative embodiments, like reference numbers are used to designate like elements.

Figure 1:
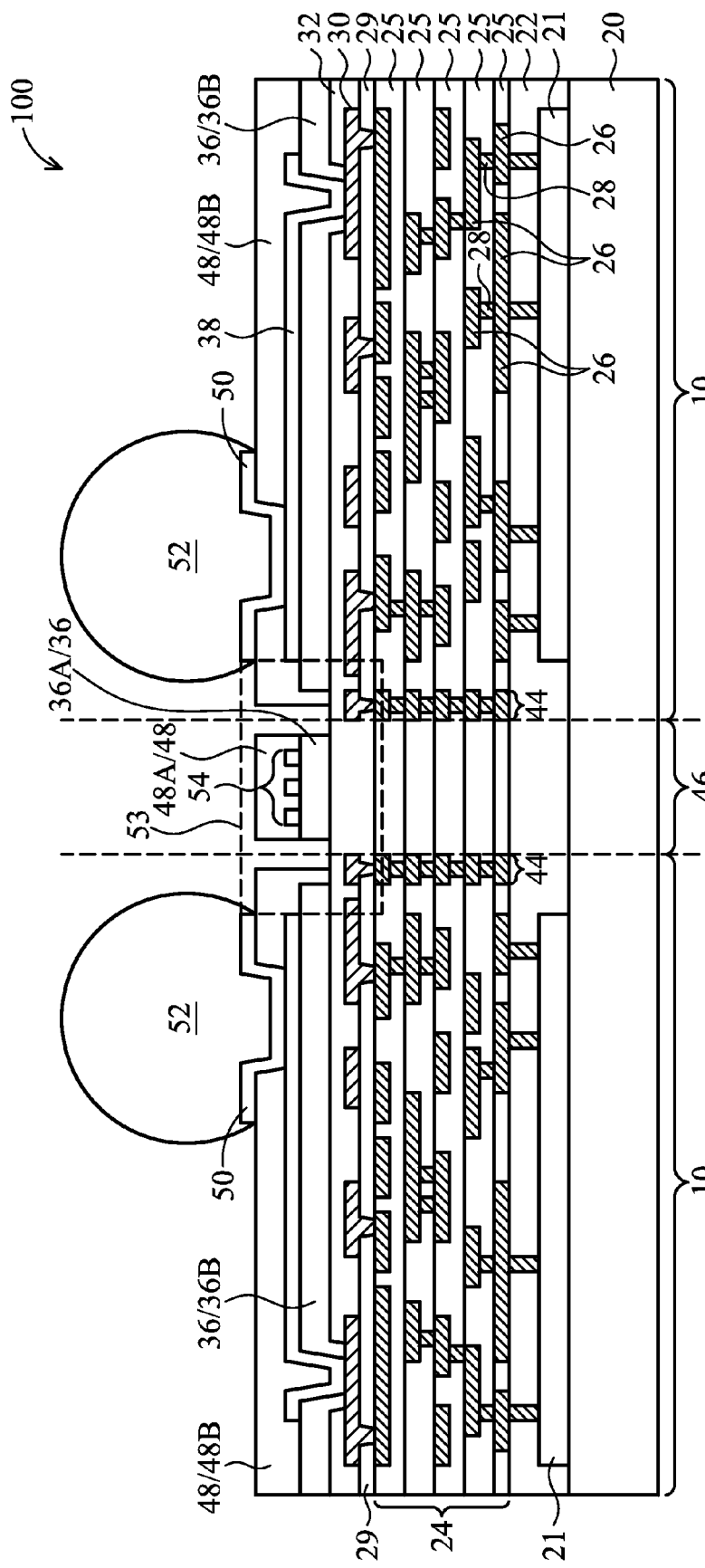
FIG. 1 illustrates a cross-sectional view of a portion of a wafer in accordance with some exemplary embodiments, wherein the wafer includes a Post-Passivation Interconnect (PPI) monitor structure.

Referring to FIG. 1, wafer 100 is illustrated. Wafer 100 includes chips 10. Chips 10 may be identical to each other, and hence the discussion and the illustration referring to one of the chips 10 may apply to all chips 10. As shown in FIG. 1, wafer 100 includes semiconductor substrate 20 extending into chip 10, which may be a bulk silicon substrate or a silicon-on-insulator substrate. Alternatively, other semiconductor materials that include group III, group IV, and/or group V elements may also be used, which semiconductor materials may include silicon germanium, silicon carbon, and III-V compound semiconductor materials. Integrated circuit devices such as transistors (schematically illustrated as 21) are formed in and/or on semiconductor substrate 20. Chips 10 may further include Inter-Layer Dielectric (ILD) 22 over semiconductor substrate 20, and interconnect structure 24 over ILD 22. Interconnect structure 24 includes metal lines 26 and vias 28, which are formed in dielectric layers 25. The combination of metal lines at a same level is referred to a metal layer hereinafter. In some embodiments, interconnect structure 24 includes a plurality of metal layers that are interconnected through vias 28. Metal lines 26 and vias 28 may be formed of copper or copper alloys, although they can also be formed of other metals. In some embodiments, dielectric layers 25 are formed of low-k dielectric materials. The dielectric constants (k values) of the low-k dielectric materials may be less than about 3.0, or less than about 2.5, for example. Passivation layer 29 (sometimes referred to as passivation-1) may be formed over interconnect structure 24, wherein vias are formed in passivation layer 29 to connect metal lines 26 and vias 28 to overlying metal pads 30.

Metal pads 30 are formed over passivation layer 29, and may be electrically coupled to integrated circuit devices 21 through metal lines 26 and vias 28. Metal pads 30 may be aluminum pads or aluminum-copper pads, although other metallic materials may be used. Passivation layer 32 (sometimes referred to as passivation-2) is formed over passivation layer 29. A portion of passivation layer 32 may cover the edge portions of metal pads 30, and central portions of metal pad 30 are exposed through an opening in passivation layer 32. Each of passivation layers 29 and 32 may be a single layer or a composite layer, and may be formed of a non-porous material. In some embodiments, one or both of passivation layers 29 and 32 is a composite layer comprising a silicon oxide layer (not shown), and a silicon nitride layer (not shown) over the silicon oxide layer. Passivation layers 29 and 32 may also be formed of other non-porous dielectric materials such as Un-doped Silicate Glass (USG), silicon oxynitride, and/or the like.

Polymer layer 36 is formed over passivation layer 32. Polymer layer 36 may comprise a polymer such as polyimide, BenzoCycloButene (BCB), PolyBenzOxazole (PBO), and the like. The formation methods may include spin coating, for example. Polymer layer 36 may be dispensed in a liquid form, and then cured.

Polymer layer 36 is patterned, and PPIs 38 are formed, which include portions overlying polymer layer 36, and portions extending into polymer layer 36 to electrically couple to metal pads 30. The term "PPI" indicates that the formation of PPIs 38 is after the formation of passivation layer 32. In some embodiments, the formation of PPIs 38 includes depositing a seed layer (not shown), forming and patterning a mask layer (not shown) over the seed layer, and then plating a metal layer over the seed layer and in the openings of the mask layer. The seed layer may include a titanium layer and a copper layer over the titanium layer, and may be deposited using Physical Vapor Deposition (PVD). The metal layer may be formed of pure copper, substantially pure copper, or a copper alloy, and may be formed using plating. After the formation of the metal layer, the mask layer is removed. An etching step may be performed to remove the portions of the seed layer underlying the removed mask layer. In the etching step, if process is not controlled accurately, residues of the seed layer may be left, and the residues may cause leakage or the shorting between neighboring PPIs 38.

FIG. 1 also illustrates the formation of polymer layer 48 and Under-Bump-Metallurgy (UBM) layers 50. Polymer layer 48 may comprise polyimide or other polymer-based material such as PBO and BCB. In some embodiments, polymer layer 48 is formed using spin coating. Polymer layer 48 comprises portions over PPIs 38.

UBM layers 50 are formed to electrically couple to PPIs 38. In some embodiments, each of UBM layers 50 includes a barrier layer and a seed layer (not shown) over the barrier layer. UBM layers 50 extend into the opening in polymer layer 48, and are electrically coupled to, and may be in physical contact with, PPIs 38. The barrier layer may be a titanium layer, a titanium nitride layer, a tantalum layer, a tantalum nitride layer, or a layer formed of a titanium alloy or a tantalum alloy.

Connectors 52 are formed over UBM layers 50. In some embodiments, connectors 52 are metal regions, which are either solder balls placed on UBM layers 50, or pillars formed on UBM layers 50 through plating. In the embodiments wherein solder balls are used, the solder balls may go through a reflow process. In alternative embodiments, connectors 52 comprise metal pillars, which may be copper pillars. Additional layers such as a nickel layer, a solder cap, a palladium layer, and the like, may also be formed on each of the metal pillar.

A seal ring(s) 44 is formed in the peripheral regions of each of chip 10. Seal ring 44 includes a plurality of metal lines and vias interconnected to form a solid ring. Between seal rings 44 of the neighboring chips 10 is scribe line 46, which will be sawed in subsequent processes in order to separate chips 10 from each other. PPI monitor unit 54 may be formed in scribe line 46. PPI monitor unit 54 includes PPI portions in the same layer as, and formed simultaneously as, PPIs 38. Furthermore, PPI monitor unit 54 may, or may not, include additional layers overlying and/or underlying the PPI portions.

Figure 2:
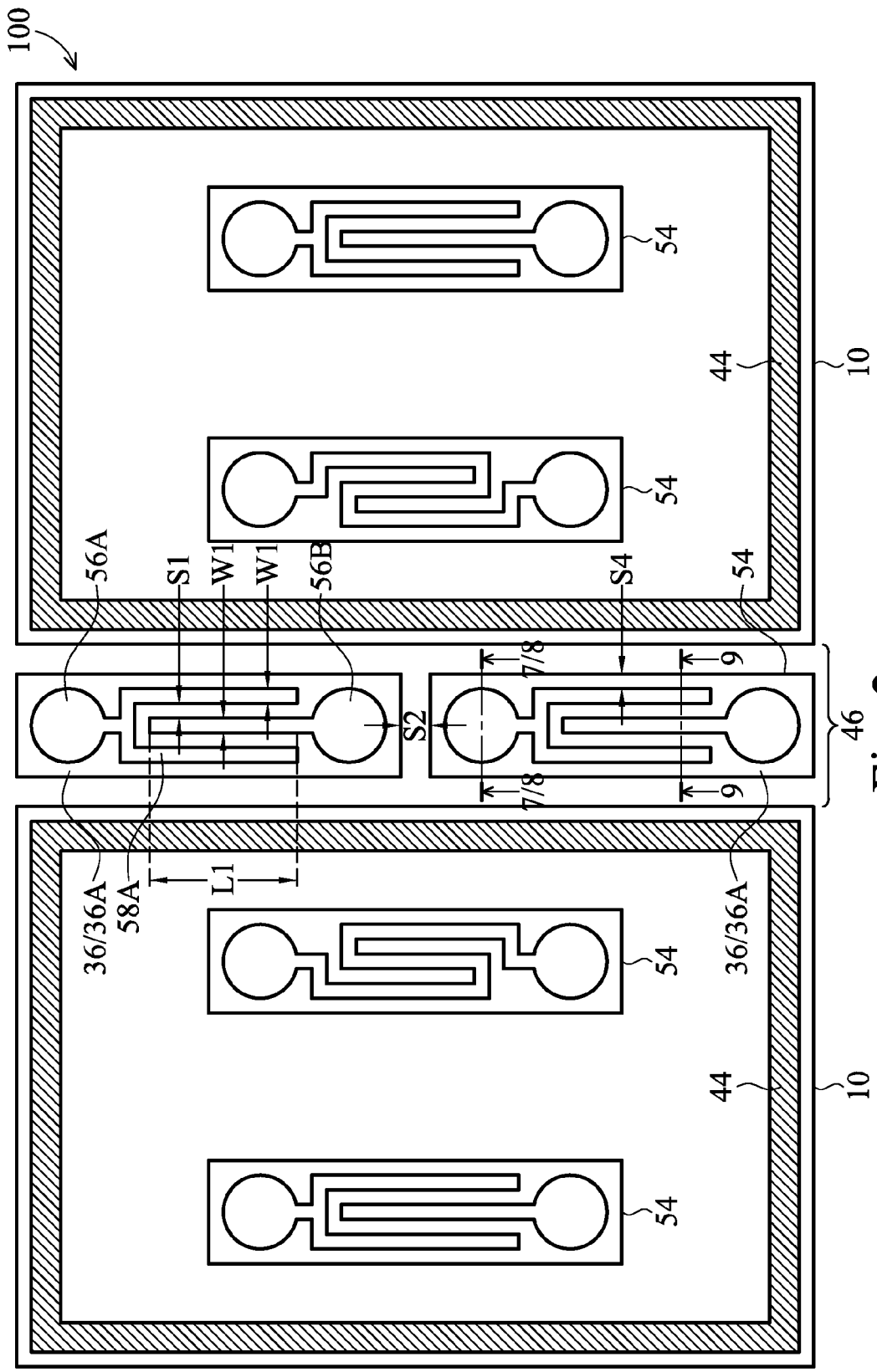
FIG. 2 illustrates a top view of a portion of the wafer in FIG. 1.
Figure 4:
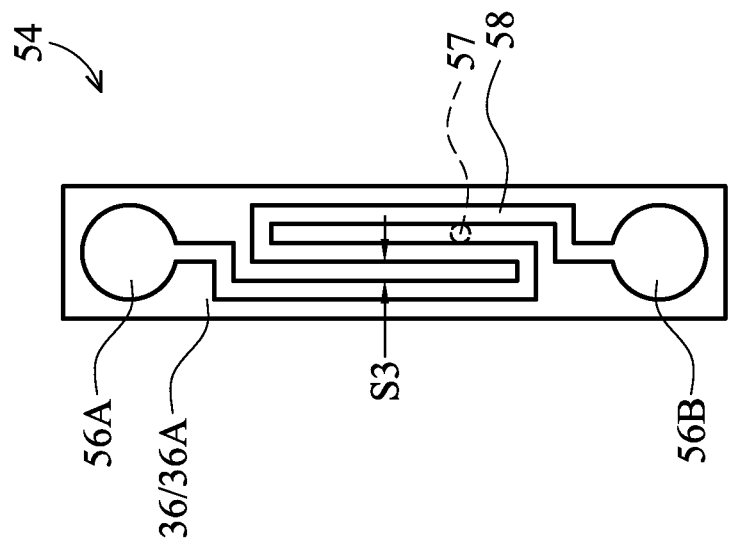
FIGS. 3 through 5 illustrate the top views of PPI monitor structures in accordance with various embodiments, wherein the PPI monitor structures include leakage monitor structures, sheet resistance monitor structures, and contact resistance monitor structures.
Figure 3:
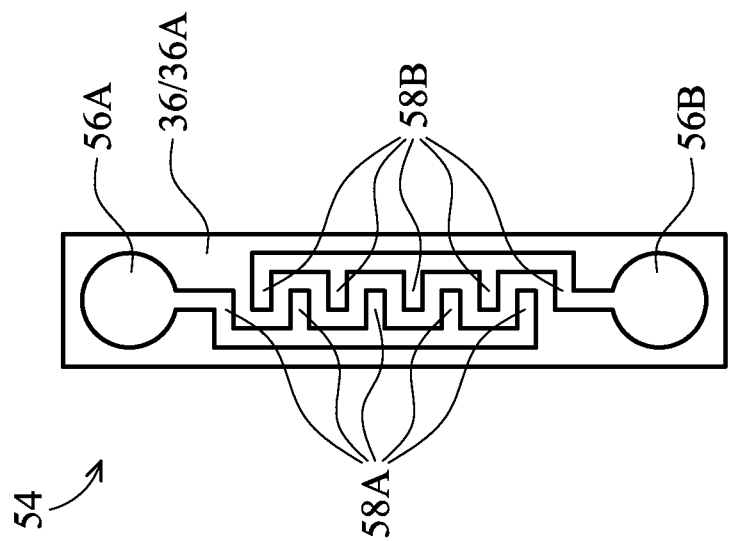
Figure 5:
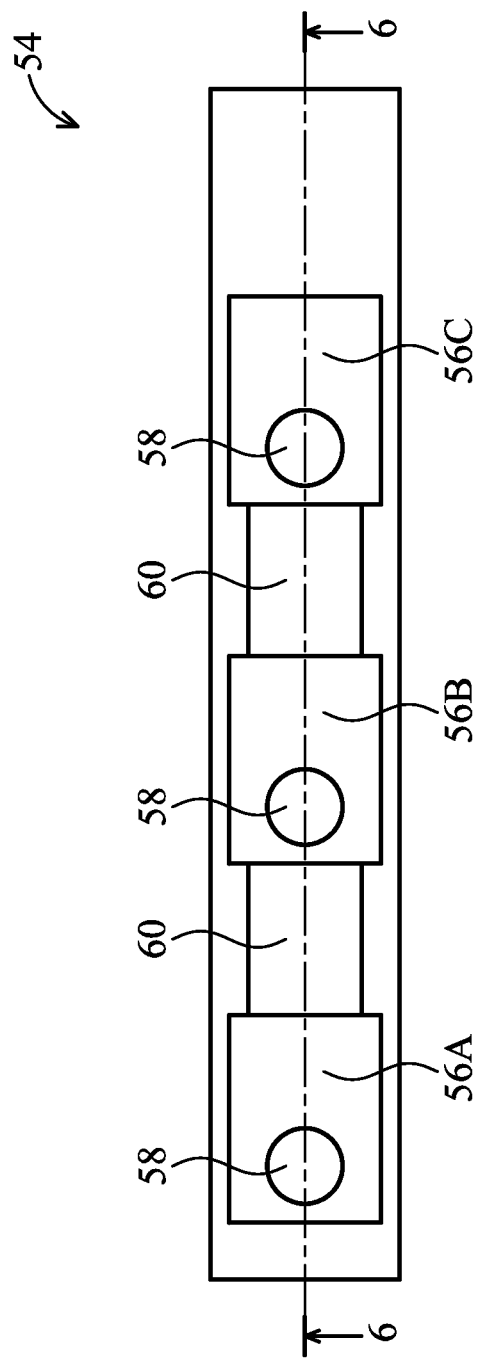

FIG. 2 illustrates a top view of the structure in FIG. 1, wherein chips 10 and scribe line 46 are schematically illustrated. In accordance with some exemplary embodiments, scribe line 46 includes PPI monitor units 54 that have a same structure. In alternative embodiments, PPI monitor units 54 may include other structures as shown in FIGS. 3 through 5. PPI monitor units 54 that have different structures may be allocated in scribe line 46 in any combination. For example, one of PPI monitor units 54 having the structure as the one in scribe line 46 may be adjacent to a PPI monitor unit 54 having any of the structures shown in FIGS. 3 through 5. Furthermore, PPI monitor units 54 may be formed in scribed line 46, and/or inside chips 10, as illustrated in FIG. 2.

As shown in FIG. 2, PPI monitor unit 54 in accordance with some embodiments includes PPI pads 56A and 56B, and PPI traces 58A and 58B, which are formed over polymer layer 36 (FIGS. 1 and 7-11). PPI pad 56A and PPI trace 58A are interconnected. PPI pad 56B and PPI trace 58B are interconnected, and are disconnected from PPI pad 56A and PPI trace 58A. In some embodiments, PPI traces 58A and 58B have longitudinal directions parallel to each other, which longitudinal directions may also be parallel to the longitudinal direction of scribe line 46. PPI traces 58A and 58B also have small distance S1, which may be between about 5 µm and about 15 µm, for example. It is appreciated, however, that the values recited throughout the description are merely examples, and may be changed to different values. The portions of PPI traces 58A and 58B that are parallel to each other and aligned to each other may have length L1, wherein ratio L1/S1 may be greater than about 5, 10, 20, or greater. With a great length L1 and a small distance S2, if the seed layer for forming PPIs 38 (FIG. 1) have any residue left after the formation of PPIs 38, the residues of the seed layer also have a high chance to occur between PPI traces 58A and 58B, so that such process problem may be found through the measurement of the resistance between PPI pads 56A and 56B. Width W1 of PPI traces 58A and 58B may also be between about 5 µm and about 15 µm.

At least some portions of PPI monitor units 54 are formed over polymer layer 36. Experiment results indicate that during the die-saw of wafer 100, during which scribe line 46 is sawed through, polymer layer 36 may shrink and cause reliability problems. As a result, as shown in FIG. 2, each of PPI monitor units 54 may be resided over one discrete portion 36A of polymer layer 36, which discrete portion 36A of polymer layer 36 is separated from portions 36B of polymer layer 36 in chips 10 (FIGS. 7 through 11), and separated from portions 36A of polymer layer 36 over which other PPI monitor units 54 are disposed. In some embodiments, distance S2 between neighboring discrete portions 36A of polymer layer 36 is greater than about 5 µm. Distance S2' (FIG. 7) between discrete portions 36A and 36B may also be greater than about 5 µm. Furthermore, in some embodiments, each of discrete portions 36A of polymer layer 36 has a single one of PPI monitor units 54 disposed thereon, and two PPI monitor units 54 are not disposed over the same discrete portion 36A. The distance S4 between PPI monitor units 54 and the closest edges of the respective underlying discrete portion 36A may be smaller than about 15 µm, and may be greater than about 5 µm.

FIGS. 3 through 5 illustrate exemplary PPI monitor units 54 that may replace any of the PPI monitor units 54 in FIG. 2. For example, FIG. 3 illustrates that PPI traces 58A and 58B include a plurality of inter-locked legs that are close to each other, wherein traces 58A and 58B are electrically disconnected from each other. The neighboring legs include portions that are parallel to and close to each other, so that when residues of the seed layer of PPIs 38 are not removed completely, residues may also be left between the legs of PPI monitor units 54. The residue will cause the resistance between PPI pads 56A and 56B to be changed. Hence, by probing PPI pads 56A and 56B, the resistance may be known.

FIGS. 2 and 3 illustrate PPI monitor units 54 that may be used to monitor leakages between PPIs 38. FIG. 4 illustrates PPI monitor unit 54 that is used for monitoring the resistances of PPIs 38. In these embodiments, between PPI pads 56A and 56B is a continuous PPI trace 56, which may have a serpentine layout, and may have a substantially uniform width. Since PPI trace 56 is formed in the same process step for forming PPIs 38 (FIG. 1), the resistance probed between PPI pads 56A and 56B may reflect the process variation that affects the uniformity of the width of PPI trace 56. Furthermore, if residue 57 is left un-removed, the probed resistance will also be reduced, revealing the possible occurrence of the residue. Spacing S3 between neighboring parallel pieces of PPI trace 56 may be between about 5 µm and about 15 µm in some embodiments.

Figure 6:
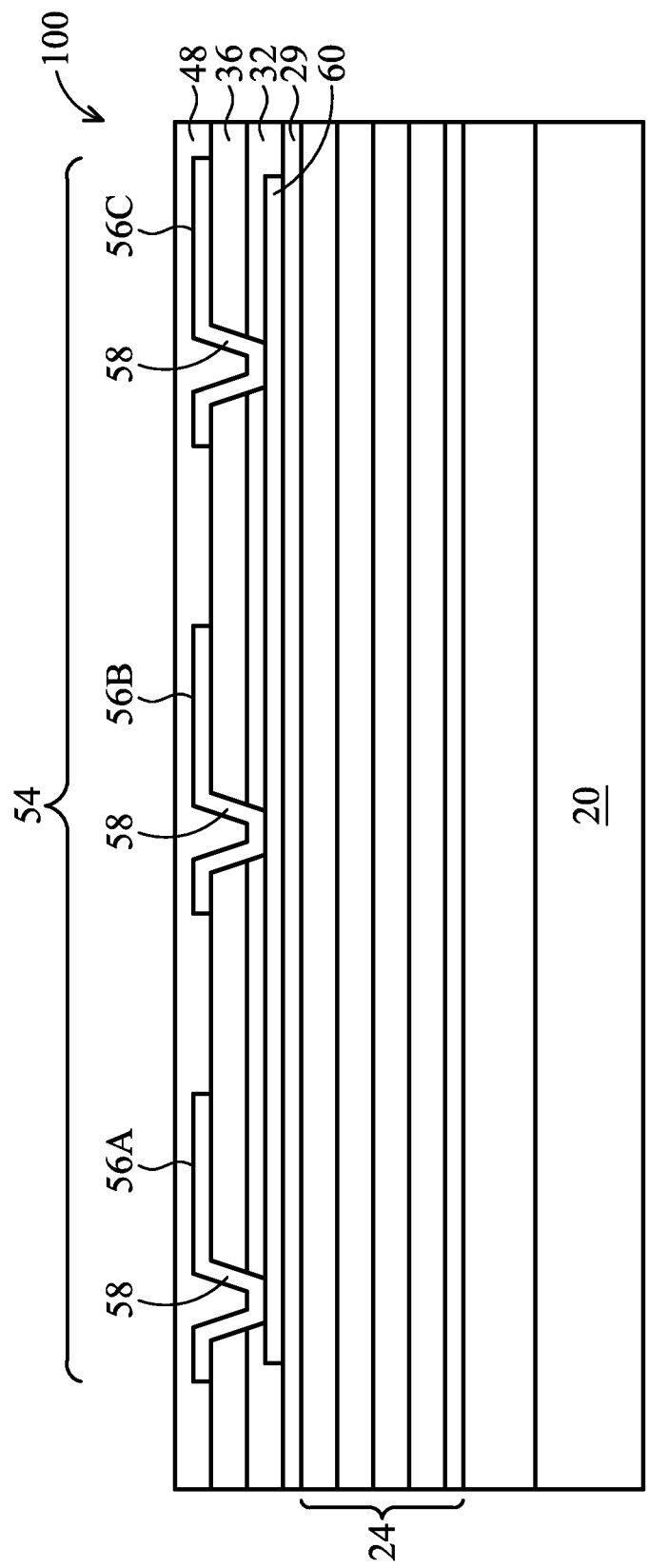
FIG. 6 illustrates a cross-sectional view of the PPI monitor structure in FIG. 5.

FIGS. 5 and 6 illustrate a top view and a cross-sectional view, respectively, of PPI monitor unit 54 in accordance with alternative embodiments. The cross-sectional view of the structure in FIG. 6 is obtained from the plane crossing line 6-6 in FIG. 5. PPI monitor unit 54 in accordance with these embodiments may be used to monitor the contact resistance between metal lines (such as metal line 60) and the respective overlying PPIs (such as PPI pads 56A, 56B, and 56C). Vias 58 are made to penetrate through polymer layer 36, and electrically couple metal line 60 to PPI pads 56A, 56B, and 56C. Vias 58 and PPI pads 56A, 56B, and 56C are formed in the same process for forming PPIs 38 (FIG. 1). Metal line 60 is formed in the same process, and is at the same level, as metal pads 30 (FIG. 1). When the via openings in which vias 58 are formed, residues (such as polymer residues) may be left in the via openings, causing the contact resistance between vias 58 and metal line 60 to increase. Such increase in the contact resistance may be monitored using PPI monitor unit 54 in FIGS. 5 and 6. The monitor process may include probing the resistance between PPI pads 56A and 56B, the resistance between PPI pads 56A and 56C, and the resistance between PPI pads 56B and 56C, and comparing the results.

Figure 7:
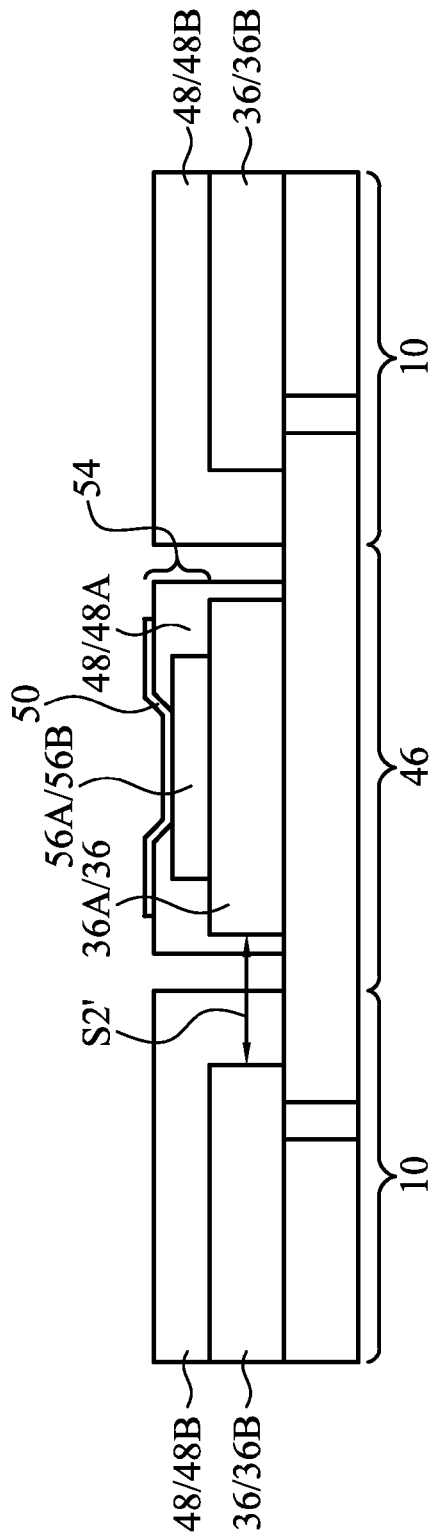
FIGS. 7 and 8 illustrate the cross-sectional views of some PPI monitor structures, wherein the PPI monitor structures are covered by a polymer layer.

FIGS. 7 through 11 illustrate the cross-sectional views of PPI monitor units 54 in accordance with various embodiments, wherein the cross-sectional views may be obtained from each of FIGS. 2 through 6. The formation of PPI monitor units 54 in each of FIGS. 7 through 11 may include blanket forming polymer layer 48, and then patterning polymer layer 48. FIG. 7 illustrates the cross-sectional view of PPI monitor unit 54 in accordance with some embodiments. The cross-sectional view is obtained from the plane crossing PPI pads 56A or 56B in FIG. 2, which plane crosses the line marked as 7/8-7/8 in FIG. 2 as an example. In these embodiments, PPI monitor unit 54 is disposed over polymer layer 36. UBM 50 is formed over, and may contact, each of PPI pads 56A and 56B (and 56C, if any), which are shown in FIGS. 2 through 6. In the formation of the respective wafer 100 (FIG. 1), a probing on PPI monitor unit 54 may be performed after the formation of PPIs 38 and PPI monitor unit 54, and before the formation of polymer layer 48. Furthermore, after the formation of polymer layer 48 and PPIs 38, a further probing step of PPI monitor unit 54 may be performed through UBMs 50.

Figure 8:
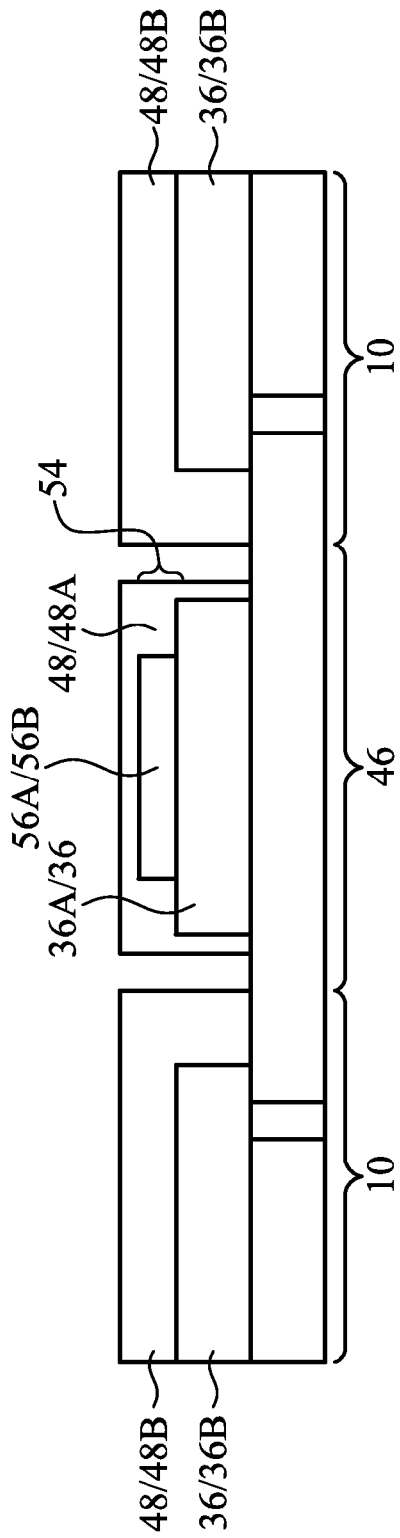

FIG. 8 illustrates the cross-sectional view of PPI monitor unit 54 in accordance with alternative embodiments. In these embodiments, an entirety of PPI monitor unit 54 is covered by polymer layer 48, and no UBM is formed over and connected to PPI pads 56A and 56B. The cross-sectional view is obtained from the plane crossing PPI pads 56A or 56B in FIG. 2, which plane crosses the line marked as 7/8-7/8 in FIG. 2 as an example.

Figure 9:
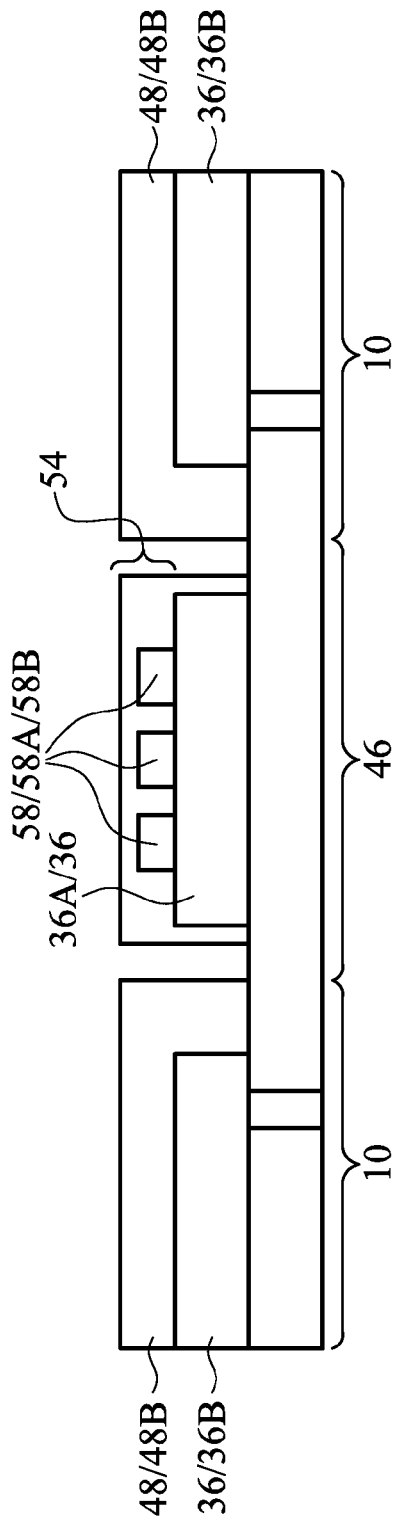
FIG. 9 illustrates the cross-sectional view of the PPI monitor structures in FIGS. 7 and 8.

FIG. 9 illustrates the cross-sectional view of PPI monitor unit 54 corresponding to the embodiments in FIGS. 7 and 8, wherein the cross-sectional view is obtained from the plane crossing PPI traces 58A and 58B in FIG. 2, which plane crosses the line marked as 9-9 in FIG. 2 as an example. FIG. 9 illustrates that PPI traces 58A and 58B are covered by polymer layer 48.

In the embodiments in FIGS. 7 and 8 (which embodiments are also shown in FIG. 9), at least portions of, and possibly an entirety of, PPI monitor unit 54 is covered by discrete portion 48A of polymer layer 48, which portion 48A is separated from other discrete portion 48A on which other PPI monitor unit 54 are formed, and separated from portions 48B of polymer layer 48 in chips 10.

Figure 10:
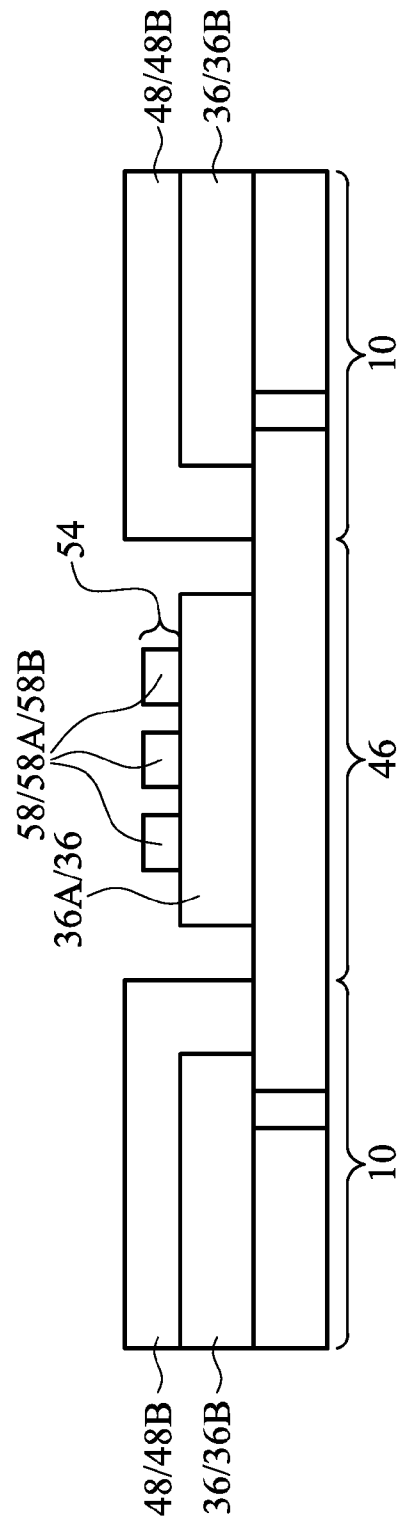
FIGS. 10 and 11 illustrate the cross-sectional views of some PPI monitor structures, wherein the PPI monitor structures are not covered by a polymer layer.
Figure 11:
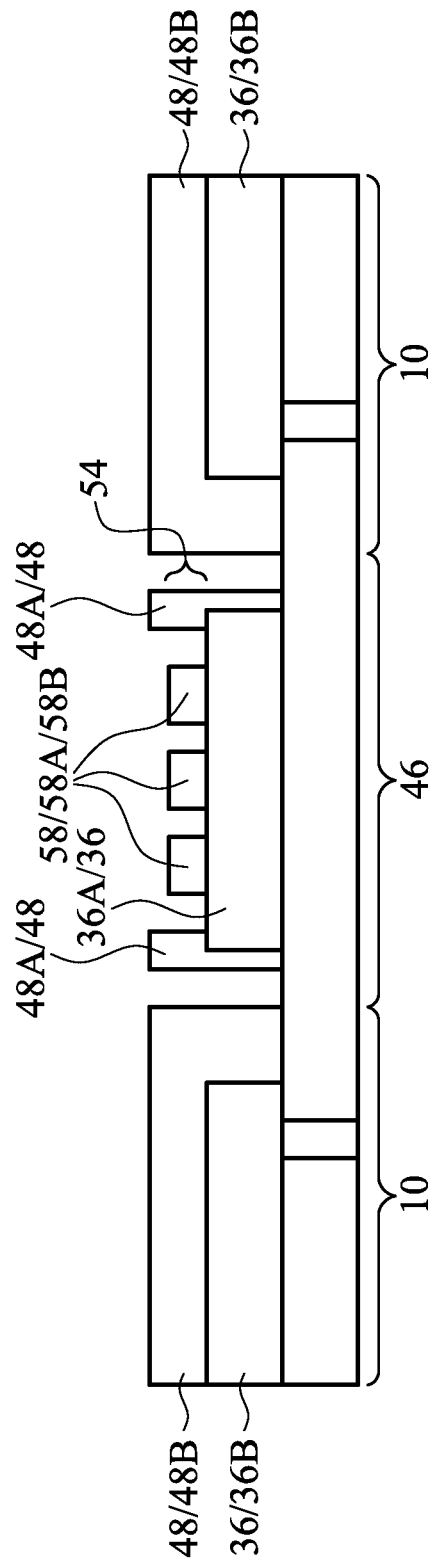

FIGS. 10 and 11 illustrate embodiments that are alternative to the embodiments in FIGS. 7 through 9. In FIG. 10, polymer layer 48 does not comprise any portion covering PPI monitor unit 54. Polymer layer 48, however, still comprises portions 48B in chips 10. In FIG. 11, polymer layer 48 comprises discrete portion 48A covering some portion of discrete portion 36A of polymer layer 36, and an opening (or openings) is formed to expose PPI monitor unit 54. Polymer portion 48A in these embodiments is formed in scribe line 46, and is separated from the portions 48B of polymer layer 48 in chips 10. Furthermore, portion 48A may be separated from other discrete portions 48A, under which other PPI monitor unit 54 are formed.

In accordance with some embodiments, an entirety of PPI monitor unit 54 (such as in FIGS. 2-4) is disposed over polymer layer 36, and PPI monitor unit 54 is not electrically coupled to conductive features that extend into and/or underlying polymer layer 36. In these embodiments, PPI monitor unit 54 may include a first portion including 56A and 58A, and a second portion including 56B and 58B, wherein one or both of the first portion and the second portion is electrically floating. In alternative embodiments, such as in FIGS. 5 and 6, PPI monitor unit 54 may include portions extending into polymer layer 36 or underlying layers, wherein PPI monitor unit 54 is electrically floating. In some embodiments, such as in FIGS. 2 through 4, an entirety of PPI monitor unit 54 is covered by polymer layer 48, with no UBM formed thereon, although in other embodiments, UBMs may be formed to connect to PPI monitor units 54.

Figure 12:
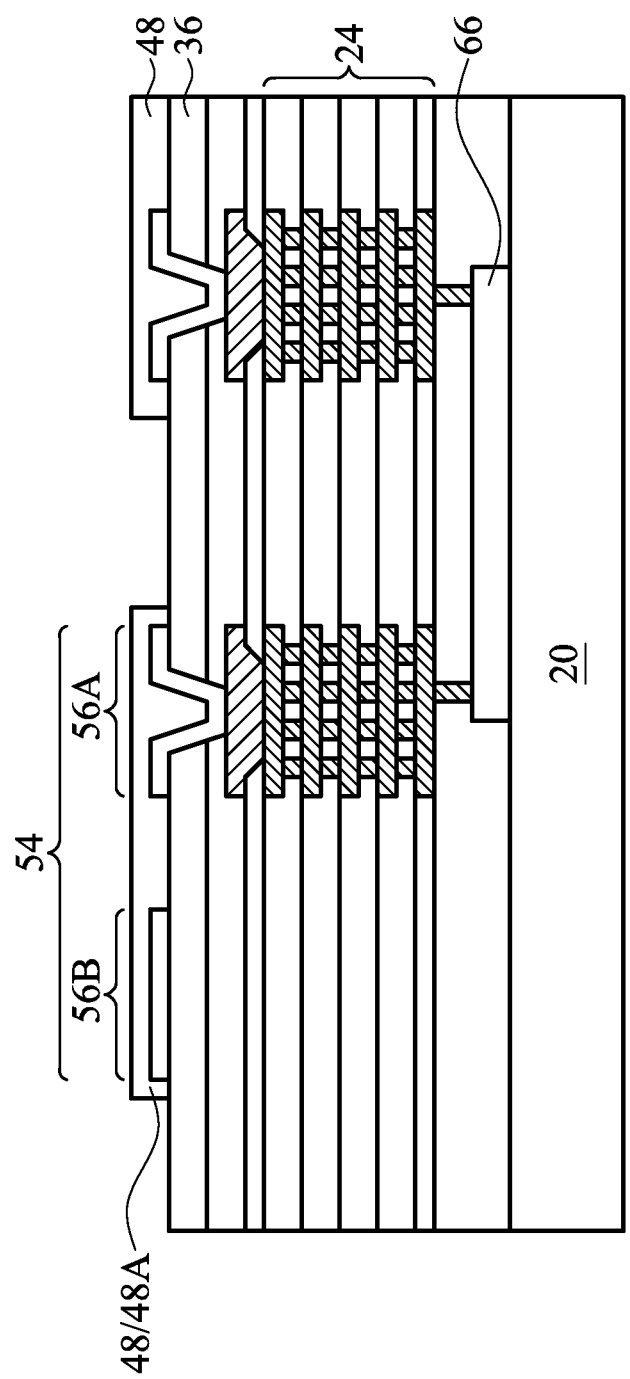
FIG. 12 illustrates a cross-sectional view of a PPI monitor structure that is used for monitoring the formation of PPIs and other integrate circuit components.

FIG. 12 illustrates PPI monitor unit 54 in accordance with yet alternative embodiments. PPI pad 56A of PPI monitor unit 54 in these embodiments is electrically coupled to integrated circuit device 66 through interconnect structure, and hence PPI pad 56A may be used to probe device 66, which may be a transistor, an functional circuit, an interconnection feature (such as metal lines, vias, or the like), or any other Device-Under-Test (DUT) that is underlying polymer layer 36. PPI pad 56A and PPI pad 56B also belong to the same PPI monitor unit 54, and hence may be used for probing leakage, resistance, or the like. PPI pad 56B may be electrically floating, and may include a single layer that is between polymer layers 36 and 48. PPI pad 56B may also be connected to other DUT, similar to PPI pad 56A.

As shown in FIG. 2, PPI monitor units 54 are formed in scribe line 46, and hence after the sawing of wafer 100, PPI monitor units 54 are damaged. In alternative embodiments, as shown in FIG. 13, dummy scribe line 146 is formed between neighboring chips 10, and is parallel to scribe line 46. Dummy scribe line 146 is also outside seal rings 44 in chips 10. PPI monitor units 54 may be formed in dummy scribe line 146, and none of PPI monitor units 54 is formed in scribe line 46. In the die-saw process of wafer 100, the kerf of the die-saw passes through scribe line 46, and does not pass through dummy scribe line 146. As a result, PPI monitor units 54 and dummy scribe lines 146 remain after the die-saw, and will be left in chips 10.

In accordance with embodiments, an integrated circuit structure includes a passivation layer, a polymer layer over the passivation layer, and a PPI monitor structure. The PPI monitor structure includes a portion overlying a portion of the polymer layer. The PPI monitor structure is electrically floating.

In accordance with other embodiments, a wafer includes a first chip and a second chip, and a scribe line between the first chip and the second chip. A passivation layer is disposed in the wafer. A polymer layer is in the wafer and over the passivation layer, wherein the polymer layer includes a first portion in the scribe line, and second portions in the first chip and the second chip. The first portion is disconnected from all portions of the first polymer layer in the first and the second chips. A PPI monitor structure has a portion overlying the first portion of the polymer layer.

In accordance with yet other embodiments, a method includes forming a passivation layer in a wafer, forming a polymer layer over the passivation layer, and forming a PPI monitor structure. The PPI monitor structure includes a portion over the polymer layer. A probing is performed to probe the PPI monitor structure, wherein a resistance between probed pads of the PPI monitor structure is measured.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
   a passivation layer;
   a first polymer layer over the passivation layer; and
   a Post-Passivation-Interconnect (PPI) monitor structure, wherein the PPI monitor structure comprises a first portion comprising:
      a metal line underlying the first polymer layer;
      a first PPI pad and a second PPI pad over the first polymer layer and physically disconnected from each other; and
      a first via and a second via in the first polymer layer and connecting the first PPI pad and the second PPI pad, respectively, to the metal line, wherein the PPI monitor structure is electrically floating.

2. The integrated circuit structure of claim 1 further comprising:
   a third PPI pad over the first polymer layer and physically disconnected from both the first PPI pad and the second PPI pad; and
   a third via in the first polymer layer and connecting the third PPI pad to the metal line.

3. The integrated circuit structure of claim 1 further comprising a second polymer layer over the first polymer layer, wherein an entirety of the PPI monitor structure is covered by the second polymer layer, with no conductive features penetrating through the second polymer layer and electrically connected to the PPI monitor structure.

4. The integrated circuit structure of claim 1, wherein the PPI monitor structure is disposed in a scribe line of a wafer, with two chips on opposite sides of the scribe line.

5. The integrated circuit structure of claim 4, wherein a portion of the PPI monitor structure is over a portion of the first polymer layer, and wherein the portion of the first polymer layer is a discrete portion disconnected from all other portions of the first polymer layer in the two chips.

6. An integrated circuit structure comprising:
   a wafer comprising:
      a first chip and a second chip;
      a scribe line between the first chip and the second chip;
      a passivation layer in the wafer;
      a first polymer layer in the wafer and over the passivation layer, wherein the first polymer layer comprises:
         a first portion in the scribe line; and
         second portions in the first chip and the second chip, wherein the first portion is disconnected from all portions of the first polymer layer in the first and the second chips; and
      a first Post-Passivation-Interconnect (PPI) monitor structure comprising a portion overlying the first portion of the first polymer layer.

7. The integrated circuit structure of claim 6, wherein the first PPI monitor structure is electrically floating.

8. The integrated circuit structure of claim 6, wherein the first portion of the first polymer layer extends beyond edges of the first PPI monitor structure by distances smaller than about 15 μm.

9. The integrated circuit structure of claim 6 further comprising:
   a third portion of the first polymer layer in the scribe line, wherein the first and the third portions of the first polymer layer are disconnected from each other; and
   a second PPI monitor structure overlapping the third portion of the first polymer layer.

10. The integrated circuit structure of claim 6 further comprising a second polymer layer over the first polymer layer, wherein the second polymer layer comprises:
    a first portion in the scribe line and covering portions of the first PPI monitor structure; and
    second portions in the first chip and the second chip, wherein the first portion of the second polymer layer is disconnected from all portions of the second polymer layer in the first and the second chips.

11. The integrated circuit structure of claim 6 further comprising a second polymer layer over the first polymer layer, wherein the second polymer layer comprises portions in the first chip and the second chip, and wherein the second polymer layer does not comprise portions overlapping the first PPI monitor structure.

12. The integrated circuit structure of claim 6, wherein an entirety of the PPI monitor structure is over the first polymer layer.

13. The integrated circuit structure of claim 6, wherein the PPI monitor structure comprises:
    a first portion comprising:
       a first PPI pad; and
       a first PPI trace connected to the first PPI pad; and
    a second portion adjacent to, and is electrical de-coupled from, the first portion, wherein the second portion comprises:
       a second PPI pad; and
       a second PPI trace connected to the second PPI pad, wherein at least one of the first portion and the second portion is electrically floating.

14. The integrated circuit structure of claim 6, wherein the PPI monitor structure comprises:
    a first PPI pad and a second PPI pad; and
    a PPI trace electrically coupling the first PPI pad to the second PPI pad.

15. A method comprising:
    forming a passivation layer in a wafer;
    forming a first polymer layer over the passivation layer;
    forming a Post-Passivation-Interconnect (PPI) monitor structure, wherein the PPI monitor structure comprises a portion over the first polymer layer; and performing a probing to probe the PPI monitor structure, wherein a resistance between probed pads of the PPI monitor structure is measured.

16. The method of claim 15 further comprising:
forming a second polymer layer over the first polymer layer and the portion of the PPI monitor structure; and
patterning the second polymer layer.

17. The method of claim 16, wherein after the step of patterning the second polymer layer, an entirety of the PPI monitor structure is covered by a portion of the second polymer layer, and wherein the portion of the second polymer layer is separated from all portions of the second polymer layer in all chips of the wafer.

18. The method of claim 16, wherein after the step of patterning the second polymer layer, an entirety of the PPI monitor structure is not covered by the second polymer layer.

19. The method of claim 16 further comprising:
forming Under Bump Metallurgies (UBMs) extending into the second polymer layer and electrically coupled to the PPI monitor structure.

20. The method of claim 15, wherein the PPI monitor structure is electrically floating.

* * * * *